(12) United States Patent
Ning et al.

(10) Patent No.: US 6,677,635 B2
(45) Date of Patent: Jan. 13, 2004

(54) STACKED MIMCAP BETWEEN CU DUAL DAMASCENE LEVELS

(75) Inventors: Xian J. Ning, Mohegan Lake, NY (US); Yi Sheng Hsieh, Hsin Chu (TW)

(73) Assignees: Infineon Technologies AG, Munich (DE); United Microelectronics Co., Hsin-Chu (TW)

( * ) Notice: Subject to any disclaimer, the term of this patent is extended or adjusted under 35 U.S.C. 154(b) by 0 days.

(21) Appl. No.: 09/870,499

(22) Filed: Jun. 1, 2001

(65) Prior Publication Data

US 2002/0182794 A1 Dec. 5, 2002

(51) Int. Cl.⁷ ................. H01L 27/108; H01L 29/76; H01L 29/94; H01L 31/119
(52) U.S. Cl. ........................ 257/303; 257/306
(58) Field of Search ................ 257/295, 296, 257/298, 300, 303, 306–310; 438/239, 253, 244, 356

(56) References Cited

U.S. PATENT DOCUMENTS

| | | | | |
|---|---|---|---|---|
| 5,985,731 A | * | 11/1999 | Weng et al. | 438/396 |
| 6,144,051 A |   | 11/2000 | Nishimura et al. | 257/277 |
| 6,146,939 A | * | 11/2000 | Dasgupta | 438/253 |
| 6,146,941 A |   | 11/2000 | Huang et al. | 438/253 |
| 6,156,600 A |   | 12/2000 | Chao et al. | 438/238 |
| 6,177,305 B1 |   | 1/2001 | Hornback et al. | 438/240 |
| 6,180,976 B1 |   | 1/2001 | Roy | 257/306 |
| 6,184,551 B1 | * | 2/2001 | Lee et al. | 257/310 |
| 6,197,650 B1 |   | 3/2001 | Wu | 438/386 |
| 6,284,586 B1 | * | 9/2001 | Seliskar et al. | 438/239 |

FOREIGN PATENT DOCUMENTS

| | | | |
|---|---|---|---|
| JP | 02000208745 A | * | 7/2000 |
| JP | 02001313371 A | * | 10/2001 |

OTHER PUBLICATIONS

R. Liu et al, "Single Mask Metal–Insulator–Metal (MIM) Capacitor with Copper Damascene metallization for sub–0.18um mixed mode signal and system–on–a–chip (SoC) applications", Proc. 2000 IITC, pp111–113 (2000).

* cited by examiner

Primary Examiner—Wael Fahmy
Assistant Examiner—Hoai Pham
(74) Attorney, Agent, or Firm—Jackson Walker L.L.P.

(57) ABSTRACT

A semiconductor device includes a structure composed of a first inter-level-dielectric with an embedded first Cu dual damascene level. A dielectric is coated on a surface of the structure, and a patterned metal layer is coated on he dielectric. A patterned inter-level-dielectric is coated on the patterned metal layer, and a second Cu dual damascene level is embedded in the patterned inter-level-dielectric. The first Cu dual damascene level, second Cu dual damascene level, and patterned metal layer respectively define the bottom, top and middle plates of a stacked MIM capacitor.

10 Claims, 2 Drawing Sheets

STACKED MIMCAP BETWEEN CU DUAL DAMASCENE LEVELS

BACKGROUND OF THE INVENTION

1. Field of the Invention

The present invention relates to a semiconductor device comprising a stacked metal-insulator-metal (MIM) capacitor in between Cu dual-damascene levels having greater chip area and wherein the thickness of the MIM capacitor dielectric is relaxed and therefore improved in yield, and a method of fabricating said semiconductor device.

2. Description of the Related Art

As semiconductor devices continue to be reduced to smaller and smaller dimensions, capacitors used in integrated circuits such as those in DRAM storage cells, need higher capacitance/unit area.

One manner of accomplishing this is to change from conventional polysilicon-insulator-polysilicon capacitors to metal-insulator-metal (MIM) capacitors.

In the MIM capacitors, metals used as the top and/or bottom electrodes are those with low oxygen affinity. On the other hand, the insulator is generally a metal oxide using metals that have a high oxygen affinity. However, due to their low oxidation resistance, these electrodes are easily oxidized in the $O_2$ ambient at the high temperatures required during fabrication. This oxidation results in reduced capacitance due to leakage in the device.

More specifically, the metal-insulator-metal capacitor (MIMCap) is a specific type of capacitor having two metal plates sandwiched around a capacitor dielectric, that is parallel to a semiconductor wafer surface. This type of metal-insulator-metal capacitor has been used in mixed mode signal processing and system-on-a-chip applications. For these type of applications, the MIMCap is built in back-end-of-line (BEOL) interconnect levels having a bottom and top metal plate that sandwiches a dielectric layer in between.

A method of fabricating a capacitance structure is disclosed in U.S. Pat. No. 6,177,305 B1. The method comprises:

forming a first electrode layer comprising titanium nitride on a wafer wherein the first electrode is formed in a chemical vapor deposition chamber;

forming an insulating layer on the first electrode layer in the CVD chamber wherein the insulating layer comprises a material selected from the group consisting of titanium oxynitride and titanium oxycarbonitride; and forming a second electrode layer comprising titanium nitride on the insulating layer, wherein the second electrode layer is formed in the CVD chamber.

A method for fabricating a capacitor in an integrated circuit is disclosed in U.S. Pat. No. 6,156,600. The method comprises:

forming a bottom electrode on a substrate;

forming a first tantalum oxide layer on the bottom electrode;

forming a first tantalum oxide nitride layer on the first tantalum oxide layer;

forming a second tantalum oxide layer on the first tantalum oxide nitride layer; and forming a top electrode.

U.S. Pat. No. 6,146,941 disclose a method of fabricating a capacitor comprising:

providing a substrate, wherein at least a gate and at least a source/drain region is formed on the substrate, and wherein a spacer is formed at a periphery of the gate and a cap layer is formed at a top of the gate;

forming an insulating layer over the substrate to at least cover the gate and the source/drain region;

patterning the insulating layer to form an opening which exposes the source/drain region, wherein the opening has a side wall;

forming a conformal glue/barrier layer on the side wall and coupled to the source/drain region;

forming a first conformal thin conductive layer on the glue/barrier layer to act as a lower electrode;

forming a dielectric thin film on the first conductive layer; and forming a second conductive layer on the dielectric thin film to act as an upper electrode.

U.S. Pat. No. 6,144,051 disclose a semiconductor device having a metal-insulator-metal-capacitor. The device comprises:

a substrate;

a metal-insulator-metal (MIM) capacitor disposed over said substrate, the MIM capacitor having a bottom electrode, a high permittivity layer, and a top electrode;

a first dielectric film at least partially covering said MIM capacitor and having an edge protruding from an edge of the bottom electrode;

a second dielectric film disposed on the first dielectric film, the second dielectric film being made from a different material than the first dielectric film;

a first opening formed in the first and second dielectric films that exposes a portion of said top electrode; and a second opening formed in the first and second dielectric films that exposes a portion of the bottom electrode.

A method for forming a capacitor in which the bottom plate and dielectric layer of the capacitor are formed before the metal interconnect is formed is disclosed in U.S. Pat. No. 6,197,650 B1. As such, thermal treatment of the dielectric layer does not affect the metal interconnect, and the conventional fault that the quality of the dielectric layer is degraded by scant annealing is avoided, and the dielectric layer and metal interconnect can be optimized.

In this method of forming a capacitor and interconnect, the material comprising the second metal layer may comprise Al and Cu.

U.S. Pat. No. 6,180,976 B1 disclose a device including a thin-film capacitor formed on a surface of a substrate. The device comprises:

a first insulating layer having a base plate of the capacitor and a first conductive feature formed entirely within said first insulating layer;

a second insulating material having a top plate of the capacitor and a second conductive feature formed therein, wherein said second conductive feature is in electrical contact with said base plate; and a dielectric material interposed between said base and top plates, wherein said dielectric material covers at least a portion of said bottom plate.

An MIMCap was built in copper damascene level using Cu as a bottom plate and a metal plate was patterned on top with a silicon nitride as a dielectric in R. Liu et al, "Single Mask Metal-Insulator-Metal (MIM) Capacitor with Copper Damascene metallization for sub-0.18 um mixed mode signal and system-on-a-chip (SoC) applications", Proc. 2000 IITC, pp111–113 (2000).

However, there is a need in the art of utilizing metal-insulator-metal capacitors (MIMCap) in making semiconductors to be able to increase or double the capacitors capacitance without additional process steps, compared to the existing methods for preparing MIMCap's.

SUMMARY OF THE INVENTION

One object of the present invention is to provide a semiconductor device comprising a stacked metal-insulator-metal (MIM) capacitor in between Cu dual-damascene levels characterized by greater chip area.

Another object of the present invention is to provide a semiconductor device comprising a stacked metal-insulator-metal (MIM) capacitor in between Cu dual damascene levels characterized by greater chip area and having a thickness of the MIM capacitor dielectric that is relaxed and therefore improved in yield.

A further object of the present invention is to provide a process for preparing a semiconductor device comprising a stacked metal-insulator-metal (MIM) capacitor in between Cu dual-damascene levels so as to increase or double the capacitor's capacitance without utilizing additional process steps, compared to existing methods for preparing MIMCap's.

DETAILED DESCRIPTION OF PREFERRED EMBODIMENT OF THE INVENTION

In general, the invention process for making a stacked MIMCap between Cu dual-damascene levels is accomplished by:

a) depositing a dielectric layer on the surface of a dual-damascene Cu in a first inter-level-dielectric and depositing a metal layer on the dielectric layer;

b) patterning the metal layer using lithography and reactive ion etching or other known etching methods to transfer the pattern to the metal layer, and cleaning the metal layer;

c) depositing an inter-level-dielectric layer on the patterned metal layer; and d) employing lithography and RIE on the deposited inter-level-dielectric pattern and filling in Cu to form a stacked MIMcap comprising a middle plate, a Cu metal bottom plate and a Cu metal top plate.

Figure 5:
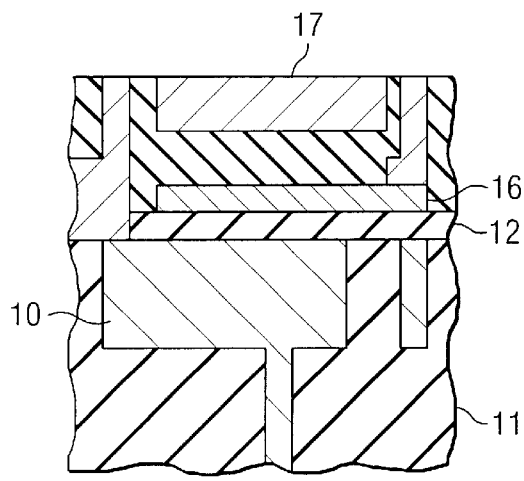
FIG. 5 is a cross-sectional view showing subjection of the structure of FIG. 4 to lithography and RIE to reform the inter-layer-dielectric layer so as to form a dual-damascene pattern and fill in the Cu, followed by CMP.
Figure 6:
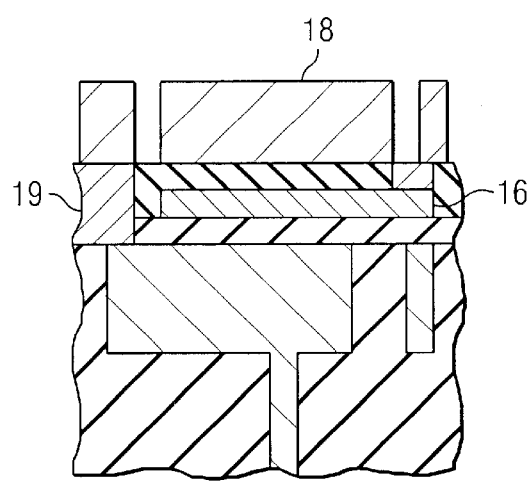
FIG. 6 shows an alternative embodiment to the dual-damascene Cu metal top plate of FIG. 5 wherein Al RIE technology is combined with either a W or Al plug V3.

Alternatively, in lieu of step d), Al RIE may be used combined with either W or a Al plug to provide an Al-metal top plate as shown in FIG. 6 instead of the Cu-metal top plate structure shown in FIG. 5.

Figure 1:
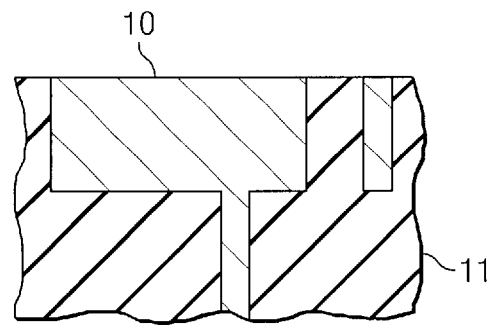
FIG. 1 is a cross-sectional view of a dual-damascene Cu in an inter-level-dielectric, wherein the structure is chemically mechanically polished (CMP), for a conventional Cu damascene wiring process.

Reference is now made to FIG. 1 to show contrast with the prior art, which shows a cross-sectional view of a dual-damascene Cu 10 in an inter-level dielectric 11 that is chemically-mechanically-polished (CMP) to a finished surface. This is a conventional Cu damascene process for wiring.

Figure 2:
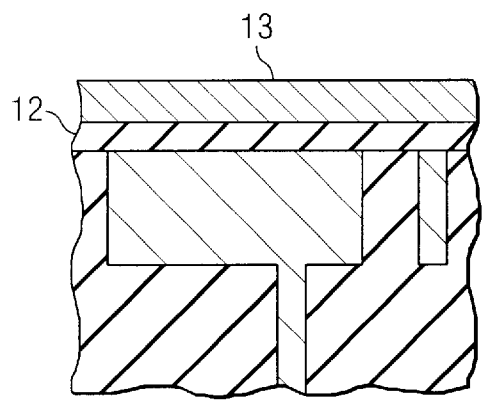
FIG. 2 shows a cross-sectional view of FIG. 1, wherein a dielectric and a metal layer Mx are deposited on the structure of FIG. 1.

The invention process commences with the step of depositing a dielectric layer 12 shown in FIG. 2, as for example by plasma enhanced chemical vapor deposition (PECVD). The preferred dielectric material should have a high dielectric constant in order to provide a high capacitance. The most preferred dielectric is silicon nitride, and the silicon nitride is deposited in a preferred thickness of about 700A. However, the thickness of the dielectric layer may range from about 500A to about 1500A. A metal layer 13 is then deposited on the dielectric layer, and the metal layer may be TiN, W, TaN, Al, Cu, Ta, Ti or any other conductors. The thickness of the metal layer may range from about 400A to 1500A, but is preferably a 700A layer in which the metal is TiN.

Figure 3:
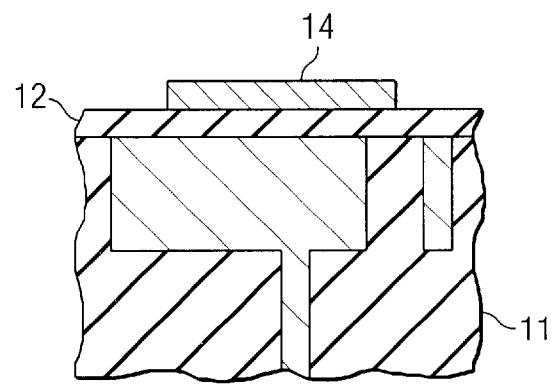
FIG. 3 shows a cross-sectional view of FIG. 2, wherein patterning of the metal layer is accomplished by lithography and reactive ion etching (RIE) to transfer the pattern to the metal layer.

The structure of FIG. 2 is then subjected to lithographic patterning followed by reactive ion etching (RIE) or other known etching methods to transfer the pattern 14 to the metal layer as shown in FIG. 3. After transference of the pattern to the metal layer, the structure of FIG. 3 is subjected to a cleaning process.

Figure 4:
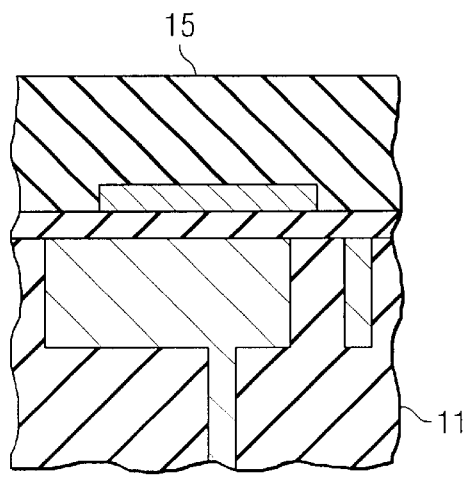
FIG. 4 depicts a cross-sectional view of FIG. 3 wherein an inter-level-dielectric layer is deposited on the patterned metal layer.

A second interlevel dielectric layer 15 is then deposited on the structure of FIG. 4 in a thickness range of from about 3000A to about 7000A. An alternative to this step is to deposit a high k dielectric such as silicon nitride of a thickness range of from about 500A to about 1500A prior to depositing the second interlevel dielectric layer 15.

By the use of lithography and reactive ion etching (RIE), the second interlevel dielectric layer of FIG. 4 is converted to form a dual-damascene pattern and Cu fill-in, followed by chemical mechanical polishing to arrive at a stacked MIMCap comprising a middle plate 16, a bottom Cu metal plate 10 and a top Cu metal plate 17. Alternatively, that is as an alternative to the dual-damascene top copper metal plate 17, an Al metal plate may be formed by using Al RIE etching combined with either W or an Al plug 19, as shown in FIG. 6. In this alternative approach, the second interlevel dielectric layer 15 of FIG. 4 is deposited in two layers in which the first layer is a MIMCap dielectric disposed in between the middle plate 16 and the top Al metal layer and the second layer to fill the gaps between the Al lines at the Al metal layer 18.

We claim:

1. A semiconductor device, comprising:

a structure including a first inter-level-dielectric, and a first dual damascene level embedded in said first inter-level-dielectric;

a dielectric coated on a surface of said structure;

a patterned metal layer coated on said dielectric;

a patterned inter-level-dielectric coated on said patterned metal layer; and a second dual damascene level embedded in said patterned inter-level-dielectric;

wherein said first dual damascene level, said second dual damascene level and said patterned metal layer respectively define bottom, top and middle plates of a stacked MIM capacitor.

2. A semiconductor device, comprising:

a structure including a first inter-level-dielectric, and a first Cu dual damascene level embedded in said first inter-level-dielectric;

a dielectric coated on a surface of said structure;

a patterned metal layer coated on said dielectric;

a patterned inter-level-dielectric coated on said patterned metal layer; and a second C dual damascene level embedded in said patterned inter-level-dielectric;

wherein said first Cu dual damascene level, said second Cu dual damascene level and said patterned metal layer respectively define bottom, top and middle plates of a stacked MIM capacitor.

3. The device of claim 2 wherein said metal layer coated on said dielectric is selected from the group consisting of TiN, W, TaN, Al, Cu, Ta or Ti.

4. The device of claim 2 wherein said dielectric is silicon nitride.

5. The device of claim 2 wherein said patterned inter-level-dielectric has a thickness of from about 3000A to a out 7000A.

6. The device of claim 2 wherein said dielectric is a high k dielectric having a thickness of from about 500 A to about 1500 A.

7. The device of claim 6 wherein said high k dielectric is silicon nitride.

8. The device of claim 2 wherein said first Cu dual damascene level and said patterned metal layer are cooperable to provide a capacitance that is half as large as a capacitance provided by said stacked MIM capacitor.

9. A semiconductor device, comprising:

a structure including a first inter-level-dielectric, and a first Cu dual damascene level embedded in said first inter-level-dielectric;

a dielectric coated on a surface of said structure;

a patterned metal layer coated on said dielectric;

a patterned inter-level-dielectric coated on said patterned metal layer; and a second Cu dual damascene level embedded in said patterned inter-level-dielectric;

wherein said first Cu dual damascene level, said second Cu dual damascene level and said patterned metal layer respectively define bottom, top and middle plates of a stacked MIM capacitor, and wherein said patterned metal layer is TiN having a thickness ranging from about 400 A to about 1,500 A.

10. The device of claim 9 wherein said TiN has a thickness of 700A.

* * * * *